United States Patent
Liehr et al.

[11] Patent Number: 5,900,065
[45] Date of Patent: May 4, 1999

[54] APPARATUS FOR THE PLASMA-CHEMICAL DEPOSITION OF POLYCRYSTALLINE DIAMOND

[75] Inventors: Michael Liehr, Feldatal; Claus-Peter Klages, Brunswick; Günter Bräuer, Freigericht, all of Germany

[73] Assignee: Leybold Systems GmbH, Main, Germany

[21] Appl. No.: 08/906,461

[22] Filed: Aug. 5, 1997

[30] Foreign Application Priority Data

Aug. 5, 1996 [DE] Germany ............... 196 31 407

[51] Int. Cl.⁶ .................................. C23C 16/00
[52] U.S. Cl. .................. 118/723 HC; 118/723 MW; 118/719; 156/345
[58] Field of Search ............ 118/723 HC, 723 MW, 118/723 MA, 723 MR, 719, 723 ME; 156/345

[56] References Cited

U.S. PATENT DOCUMENTS

| | | | |
|---|---|---|---|
| 4,830,702 | 5/1989 | Singh et al. | 156/613 |
| 4,940,015 | 7/1990 | Kobaslio et al. | 118/723 |
| 4,984,534 | 1/1991 | Ito et al. | 118/723 |
| 5,096,736 | 3/1992 | Anthony et al. | 427/38 |
| 5,132,105 | 7/1992 | Remo | 423/446 |
| 5,571,332 | 11/1996 | Halpern | 118/723 HC |

*Primary Examiner*—R. Bruce Breneman
*Assistant Examiner*—Luz Alejandro
*Attorney, Agent, or Firm*—Fulbright & Jaworski, LLP

[57] ABSTRACT

In an apparatus for the deposition of polycrystalline diamond on large, flat substrates (3) by the plasma method, with a vacuum chamber (4); with locks for the inward and outward transfer of the substrates; with a device installed in the chamber (4) for conveying the substrates (3) through at least one, preferably through two treatment stations; with hot-filament sources (5, 5', . . . ) forming a first group, installed above the plane of the substrates; with microwave plasma sources (8, 8', . . . ) forming a second group; with an electrode (11) fed with radio frequency underneath the plane of the substrates for generating a bias voltage; and with gas feed pipes (6, 9) opening into the vacuum chamber (4), the hot-filament arrangements (5, 5', . . . ), designed as linear sources, are arranged transversely to the substrate transport direction (a) and form a first coating zone ($Z^1$), where the microwave plasma sources (8, 8', . . . ) are arranged in a row a certain distance away from, and parallel to, the hot-filament sources (5, 5', . . . ) and form together a second coating zone (Z).

7 Claims, 1 Drawing Sheet

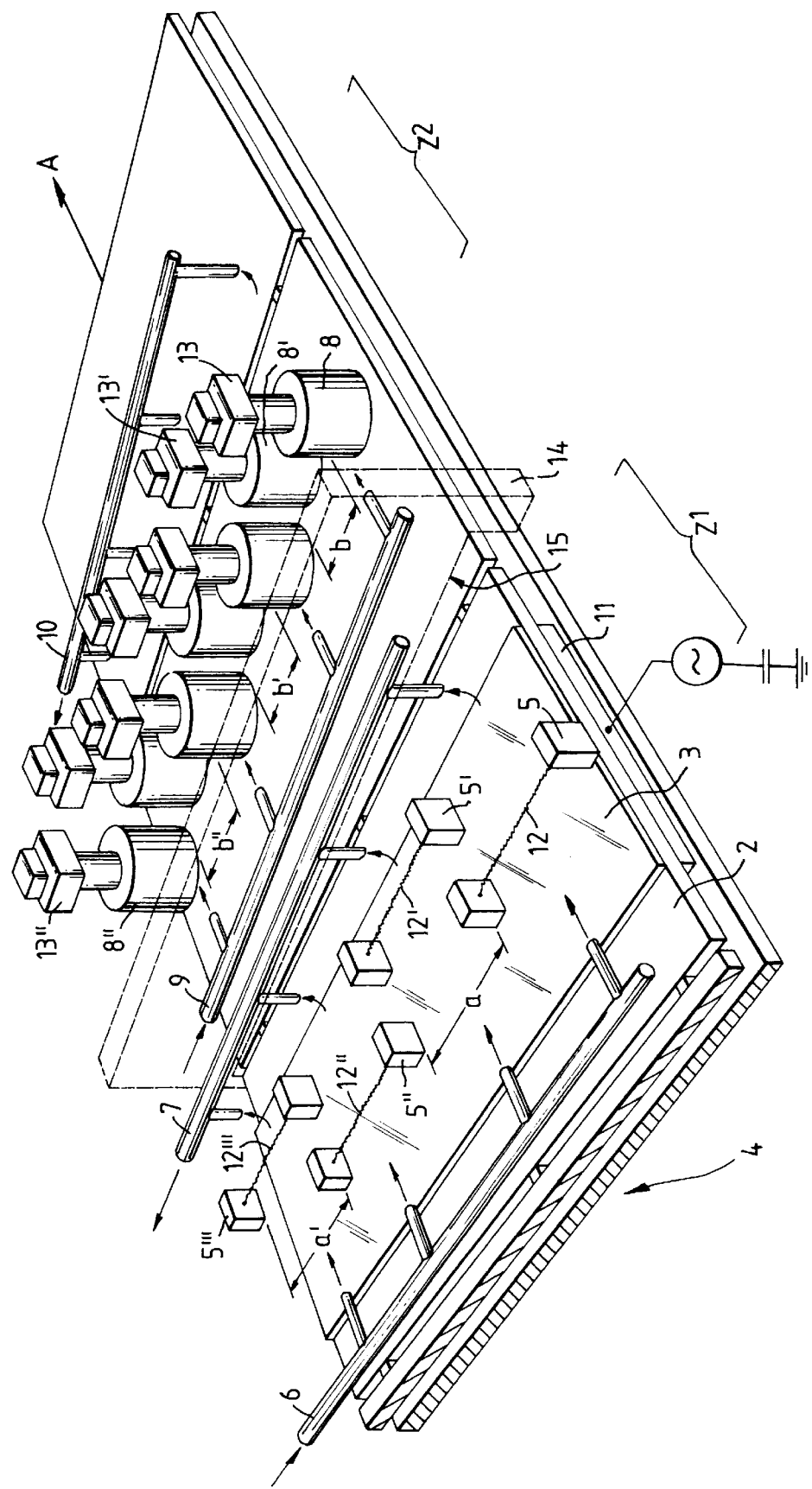

APPARATUS FOR THE PLASMA-CHEMICAL DEPOSITION OF POLYCRYSTALLINE DIAMOND

FIELD OF THE INVENTION

The invention pertains to an apparatus for the plasma-chemical deposition of polycrystalline diamond on large, flat substrates, with a vacuum chamber, with transfer locks for the inward and outward transfer of the substrates, with a device inside the chamber for conveying the substrates through at least two treatment stations, and with sources for depositing the coating installed above the substrates.

DESCRIPTION OF THE PRIOR ART

It has already been known for some time that diamonds can be grown on diamond substrates (Prof. Dr. G. Kienel: Applications, Part II, In: *Vakuumbeschichtung* 5 [*Vacuum Coating*, Vol. 5], VDI-Verlag GmbH, Düsseldorf, 1993). In addition, it has also been discovered that atomic hydrogen plays in important role in the growth process. It is also known that diamond layers can be deposited by hot-filament processes, by many different types of plasma-CVD processes (microwaves, RF, DC, arc discharge, plasma beam), and from $C_2H_2/O_2$ flames.

The method for applying diamond layers by means of hot-filament sources and especially the parameters required for it such as the pressures and process gas compositions are also known and have been described in detail (Gordon Davies: *Properties and Growth of Diamond*, Kings College, London, UK, published by INSPEC, Institute of Electrical Engineers, 1994). Further information on the state of the art and on a microwave-PECVD reactor suitable for the deposition of diamond layers can be found in Michael Liehr: *Current and Prospective Fields of Application for Diamond Thin Films*, Department of Physics, Heriot-Watt University, Edinburgh.

The basic design of CVD sources for the deposition of diamond layers has also been described (Huimin Lin and David S. Dandy: *Diamond Chemical Vapor Deposition*, *Noys Publications*, Park Ridge, N.J., USA).

Finally, production systems for coating windowpanes with optically active layers are also known (EP No. 0 219 273), in which the substrates are first conveyed through a transfer lock into the process chamber and then transported under several coating sources, preferably sputter cathodes, by a roller or plate conveyor and then transferred back out of the process chamber.

SUMMARY OF THE INVENTION

The present invention is based on the task of designing an apparatus of the type described above in such a way that, with its use, larger substrates such as windowpanes can be provided in a continuous process with a diamond layer, this apparatus being intended to make it possible to treat the substrates on a large industrial scale.

This task is accomplished in accordance with the invention by a device for conveying the substrates through the treatment stations, with hot-filament sources, forming a first group, installed above the substrate chamber; with microwave plasma generators, forming a second group; with an electrode fed with radio frequency underneath the plane of the substrates to generate a bias voltage; and with gas feed tubes opening into the vacuum chamber, where the hot-filament assemblies, which are designed as linear sources, extend transversely to the direction in which the substrates are transported and form a first coating zone, and where the micro plasma sources are arranged in a row certain distance away from, and parallel to, the hot-filament sources, and form together a second coating zone.

Additional details and features are described in greater detail herein.

BRIEF DESCRIPTION OF THE DRAWINGS

The invention can be embodied in a wide variety of ways; one of them is illustrated in purely schematic fashion in the attached drawing, which shows a perspective view of an apparatus according to the invention. For the sake of clarity, the side walls, the upper wall section, and the inward and outward transfer locks are not shown.

DETAILED DESCRIPTION

The apparatus consists essentially of a steel plate conveyor 2 for the continuous transport of flat glass panes 3 through a vacuum chamber 4; a first group of coating sources 5, 5', . . . with a gas shower 6, located upstream of the coating sources with respect to the direction of substrate transport, and with gas exhaust pipes 7, downstream of this first group; a second group of coating sources 8, 8', . . . with a gas inlet 9 upstream of them and an exhaust pipe 10 downstream of them; and an electrode 11, installed in the area of the first group of sources, connected to a high-frequency source for generating an electrical bias voltage in the area of the first group of coating sources 5, 5', . . . . The sources of the first group, designed as hot-filament sources 5, 5', . . . are attached to the vacuum chamber wall so that their electrically heated filaments 12, 12', . . . for two rows, offset with respect to each other, extending crosswise to transport direction A above the individual sources in the area of this first coating zone $Z^1$. To assist the hot-filament process during the seed-forming (nucleation) process, an electrically insulated electrode 11 is installed underneath substrate 3 and conveyor plate 2, to which a bias voltage (radio frequency) is applied. Microwave sources 8, 8', . . . of second coating zone $Z^2$ are also distributed over zone $Z_2$ in such a way that their areas of activity supplement each other and together make it possible to apply a uniform coating on substrates 3, which are traveling along underneath sources 12, 12' . . . , in the direction of arrow A.

The desired diamond layers are deposited from the gas phase in the presence of atomic hydrogen. The carbon-containing gas components (precursors), layers, form only a small percentage by volume of the gas mixture flowing in through gas spray nozzles 6, 9. Additional gases (e.g., oxygen-containing gases) can also be added to control the growth behavior and the quality of the diamond layers to be deposited. Common to all PVD methods is that the surfaces to be coated must usually be pretreated. Such pretreatment usually involves the generation of growth nuclei on the surface, which then increase in size during the following growth phase into individual crystals, which then in turn join together to form a closed layer. Without this pretreatment, the deposition of closed diamond layers is nearly impossible.

Nucleation is carried out in zone $Z^1$ by means of the hot-filament process. Atomic hydrogen and other radicals important for the CVD process in zone $Z^2$, where the crystalline diamond layers are deposited, are generated by hot filaments 12, 12', . . . by the process of thermal dissociation. Filaments 12, 12', . . . consist of a high-melting-point metal such as tungsten or tantalum and are heated to temperatures of 1,900–2,500° C. Substrate 3 is a few millimeters away from filaments 12, 12', . . . .

In the microwave plasma process operating in zone $Z^2$, the gaseous reaction partners are activated in the plasma generated by high-frequency alternating electromagnetic fields. Depending on the size of the substrate and the desired growth rate, preferably 2.45 GHz or 915 MHz microwave transmitters 13, 13', . . . in the power range of 1–75 kW (c/W) can be used.

As the drawing shows, the two zones $Z^1$, $Z^2$ are separated from each other with respect to the gases present in them by suitable design measures. The process gas for nucleation flows through gas spray nozzles 6 into the treatment area and is then drawn off through pipeline 7 from zone $Z^1$. In the same way, the process gas for the microwave plasma is introduced through gas spray nozzles 9 into the treatment area and exhausted continuously from zone $Z^2$ through exhaust pipe 10. It is advisable to provide a partition wall 14 between the two treatment zones $Z^1$ and $Z^2$ (indicated in the drawing in broken line), so that the two process gases, the compositions of which are different, will not be able to mix with each other. It is obvious that transfer locks, through which substrates 3, 3' . . . can be transported into the apparatus and then back out again, are required at both ends of the apparatus. Not shown in the drawing are cooling devices, which are used to prevent the substrates from overheating during the coating process. Such cooling devices, in the form of a system of pipelines through which a coolant is circulated, are advisably mounted on the inside walls of vacuum chamber 4.

What is claimed is:

1. Apparatus for the deposition of polycrystalline diamond by the plasma method on large, flat substrates, said apparatus comprising; a vacuum chamber having transfer locks for the inward and outward transfer of the substrates; a device supported in said chamber having for conveying the substrates through at least one treatment station; hot-filament sources in said chamber forming a first group above the place of the substrates; microwave plasma sources in said chamber forming a second group; an electrode fed with radio frequency for generating a bias voltage and installed underneath the plane of the substrates in the area of the first group; gas feed pipes opening into the vacuum chamber; wherein the hot-filament assemblies are linear sources and extend transversely to the direction of substrate transport (A), thereby forming a first coating zone ($Z^1$); and wherein the microwave plasma sources are arranged in a row spaced from and generally parallel to the hot-filament sources, said microwave sources together forming a second coating zone ($Z^1$).

2. Apparatus according to claim 1, wherein the vacuum chamber comprises therein separate compartments said compartments being separated from each other by a wall having a transfer lock, each compartment having a respective gas shower and a respective gas exhaust pipe operatively associated therewith.

3. Apparatus amending to claim 2, wherein said transfer lock is a slotted lock.

4. Apparatus amending to claim 1, wherein said device conveys said substrates through at least two treatment stations.

5. Apparatus according to claim 1, wherein the substrates rest on a conveyor moving at uniform speed below the sources.

6. Apparatus according to claim 5, wherein said conveyor is a steel plate conveyor, and said substrates rest on plates of said conveyor.

7. Apparatus according to claim 1, wherein the hot-filament sources and the microwave sources are, with respect to the transport direction, arranged in two or more successive spaced rows, the sources of adjacent rows being offset with respect to each other, so that, looking in the transport direction, a threshold level of overlap of the coating sources is achieved.

* * * * *